(12) United States Patent
Sekar et al.

(10) Patent No.: US 9,230,641 B2
(45) Date of Patent: Jan. 5, 2016

(54) FAST READ SPEED MEMORY DEVICE

(71) Applicant: Rambus Inc., Sunnyvale, CA (US)

(72) Inventors: Deepak Chandra Sekar, San Jose, CA (US); Gary Bela Bronner, Los Altos, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 37 days.

(21) Appl. No.: 14/210,085

(22) Filed: Mar. 13, 2014

(65) Prior Publication Data

US 2014/0269006 A1    Sep. 18, 2014

Related U.S. Application Data

(60) Provisional application No. 61/794,872, filed on Mar. 15, 2013.

(51) Int. Cl.
*G11C 11/00* (2006.01)
*G11C 13/00* (2006.01)

(52) U.S. Cl.
CPC .......... *G11C 13/0002* (2013.01); *G11C 13/003* (2013.01); *G11C 13/004* (2013.01); *G11C 13/0007* (2013.01); *G11C 13/0023* (2013.01); *G11C 13/0069* (2013.01); *G11C 2213/15* (2013.01); *G11C 2213/72* (2013.01); *G11C 2213/74* (2013.01); *G11C 2213/75* (2013.01); *G11C 2213/78* (2013.01); *G11C 2213/79* (2013.01)

(58) Field of Classification Search
USPC ...................................... 365/148, 158, 230.05
See application file for complete search history.

(56) References Cited

U.S. PATENT DOCUMENTS

| | | | |
|---|---|---|---|
| 5,883,829 A * | 3/1999 | van der Wagt | 365/159 |
| 7,402,847 B2 | 7/2008 | Kozicki | |
| 7,902,868 B2 | 3/2011 | Norman | |
| 8,036,018 B2 | 10/2011 | Koh | |
| 2003/0026126 A1* | 2/2003 | Uemura | 365/159 |
| 2011/0002151 A1* | 1/2011 | Javerliac et al. | 365/50 |
| 2011/0051496 A1 | 3/2011 | Chi | |
| 2012/0026779 A1 | 2/2012 | Ikegami et al. | |

OTHER PUBLICATIONS

Makoto Miyamura et al.; "Programmable Cell Array Using Rewritable Solid-Electrolyte Switch Integrated in 90nm CMOS"; IEEE ISSCC 2011; NEC Japan; 2 pages (228, 229).
Young Yang Liauw et al.; Nonvolatile 3D-FPGA with Monolithically Stacked RRAM-based Configuration Memory; IEEE ISSCC 2012; Stanford, California, US; 3 Pages (406-408).
Jason Cong et al.; mrFPGA: A Novel FPGA Architecture with Memristor-based Reconfiguration; Department of Computer Science, UCLA, Los Angeles, California; IEEE 2011; 8 Pages.

(Continued)

*Primary Examiner* — Vu Le
(74) *Attorney, Agent, or Firm* — Lowenstein Sandler LLP

(57) ABSTRACT

A memory device includes an array of resistive memory cells. Each resistive memory cell in the array includes a first resistive memory element, a second resistive memory element electrically coupled with the first resistive memory element at a common node between a first terminal of the first resistive memory element and a first terminal of the second resistive memory element, and a transistor comprising a gate electrically coupled with the common node.

17 Claims, 13 Drawing Sheets

(56) References Cited

OTHER PUBLICATIONS

Sansiri Tanachutiwat et al.; FPGA Based on Integration of CMOS and RRAM; IEEE, VLSI Systems, vol. 19, No. 11; Nov. 2011; 10 Pages (2023-2032).

Sangho Shin et al.; "Complementary Structure of Memristive Devices Basd Passive Memory Arrays"; School of Engineering, University of California, Merced, California; IEEE 2011; 4 Pages (321-324).

* cited by examiner

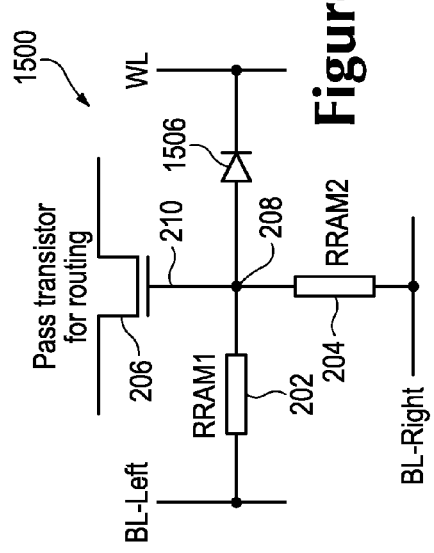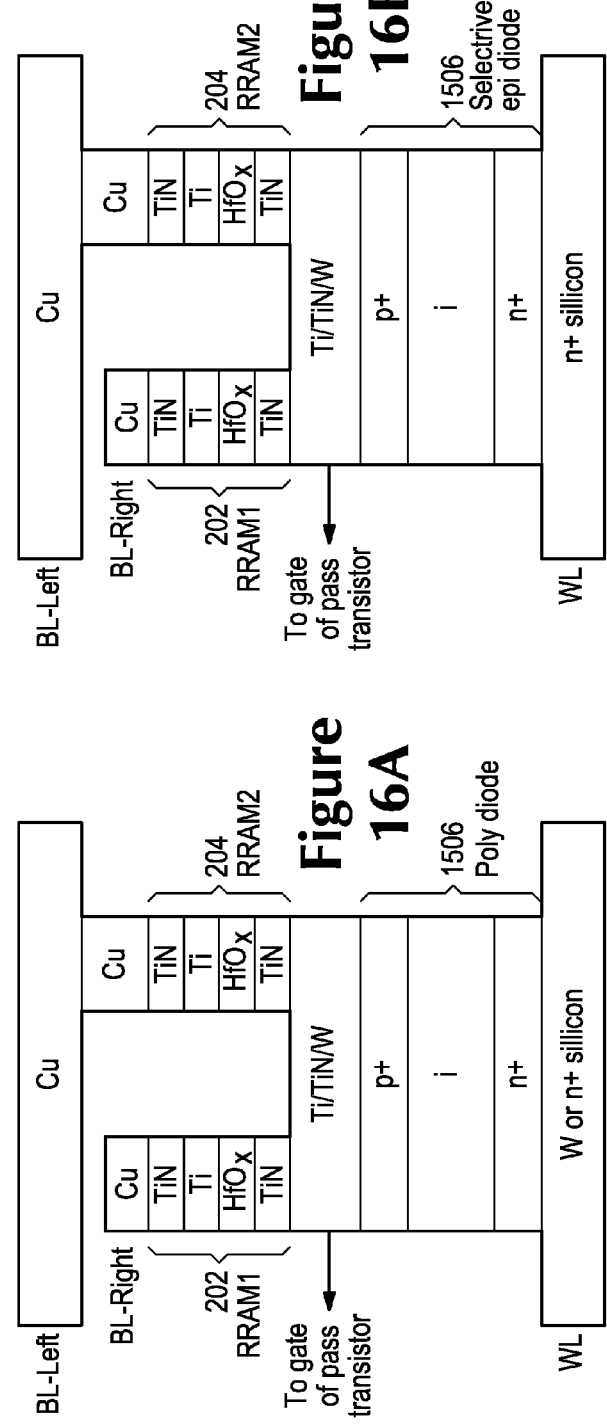

FAST READ SPEED MEMORY DEVICE

RELATED APPLICATIONS

This application is a non-provisional of and claims priority to U.S. provisional patent application Ser. No. 61/794,872, filed Mar. 15, 2013.

TECHNICAL FIELD

We disclose a memory device and, more particularly, a fast read speed memory device.

BACKGROUND

Non-volatile memory devices that retain stored data in the absence of power are pervasively used in many electronic products. Unfortunately, many non-volatile memory devices have limitations that make them unsuitable for use as primary storage for these products including higher cost and lower performance when compared to volatile memory devices such as dynamic random access memory (DRAM). Examples of non-volatile memory devices include read-only memory (ROM), flash memory, ferroelectric random access memory (FRAM), resistive random access memory (RRAM), phase change memory, and the like.

Figure 1:
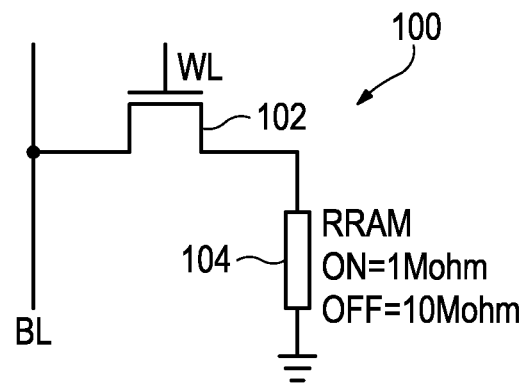

RRAM, in particular, has recently gained development momentum. Many RRAM cells have high resistances that lead to low power write or program operations at the expense of low read speed. FIG. 1 is a diagram of an RRAM cell 100 comprising one transistor 102 and one resistor 104, hence the 1T-1R moniker commonly used to denote RRAM cell 100. RRAM cell 100 may have a low ON resistance (or low resistance state LRS), e.g., 1 MΩ, and a high OFF resistance (or high resistance state HRS), e.g., 10 MΩ. Such high ON and OFF resistances in a read path lead to low sense currents, e.g., from tens of nanoamps to hundreds of nanoamps, which, in turn, result in low read speed. Many applications executing on electronic products, however, require low read latency (i.e., fast read speed) and high read bandwidth. A need exists, therefore, for an improved memory device having a fast read speed.

BRIEF DRAWINGS DESCRIPTION

Figure 2:
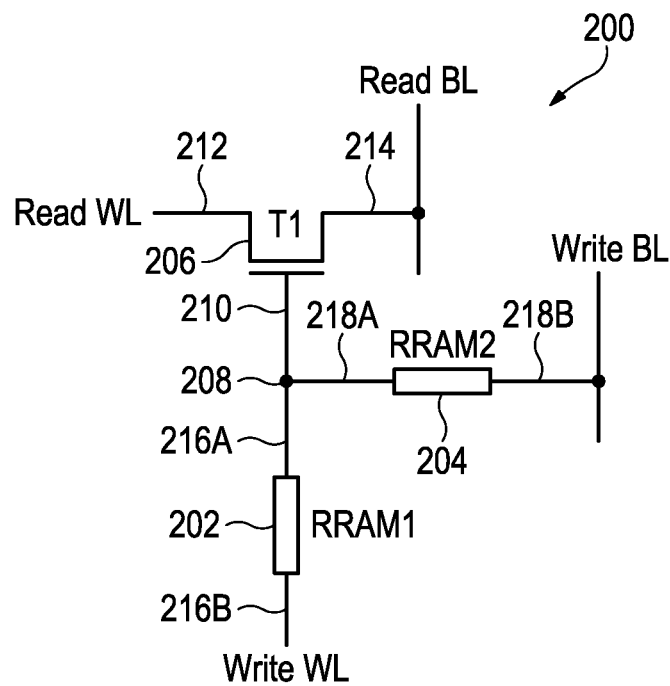
Figure 3:
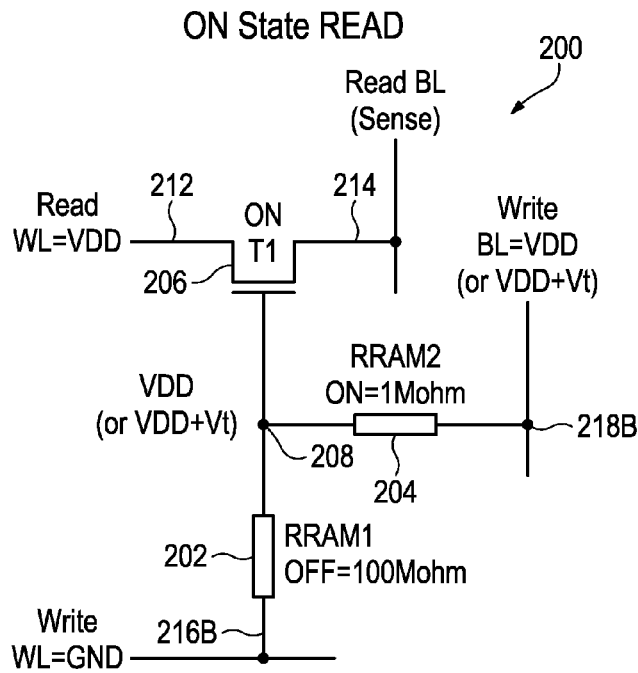
Figure 4:
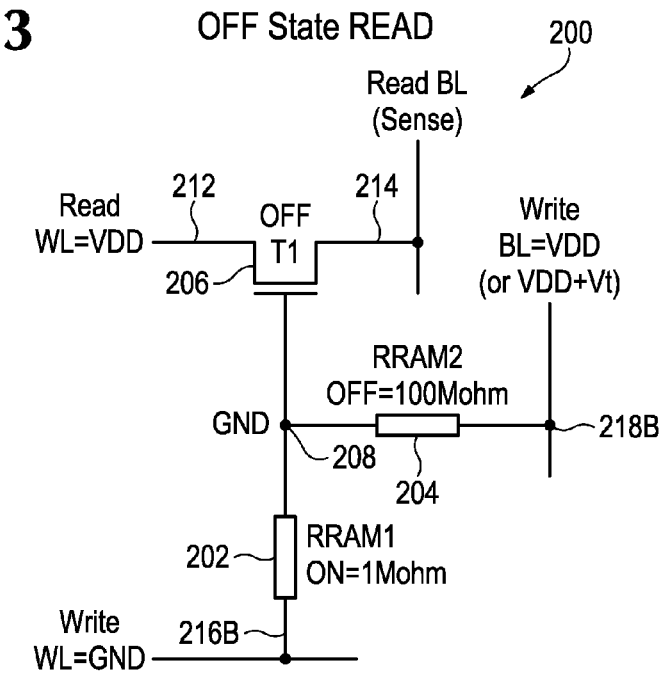
Figure 5A:
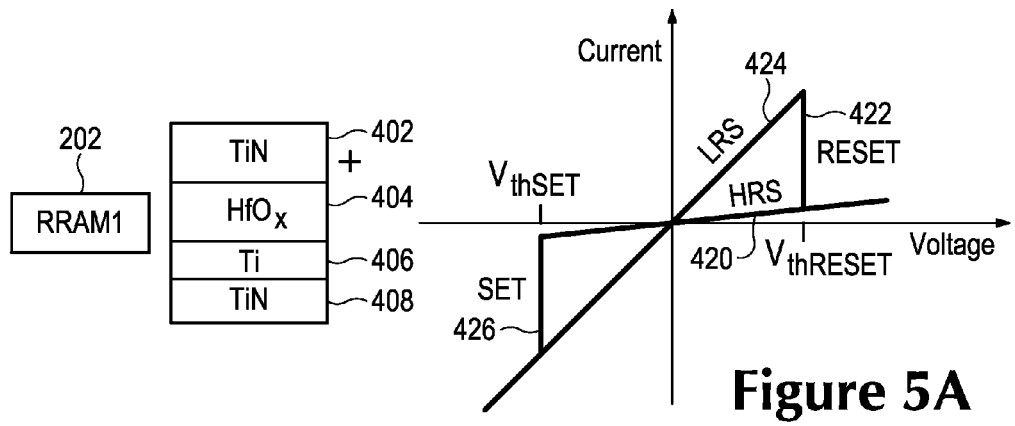
Figure 5B:
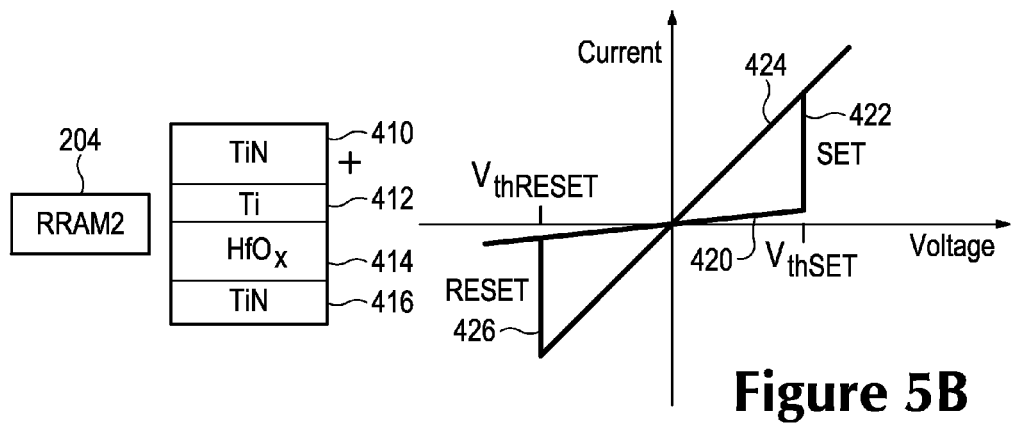
Figure 5C:
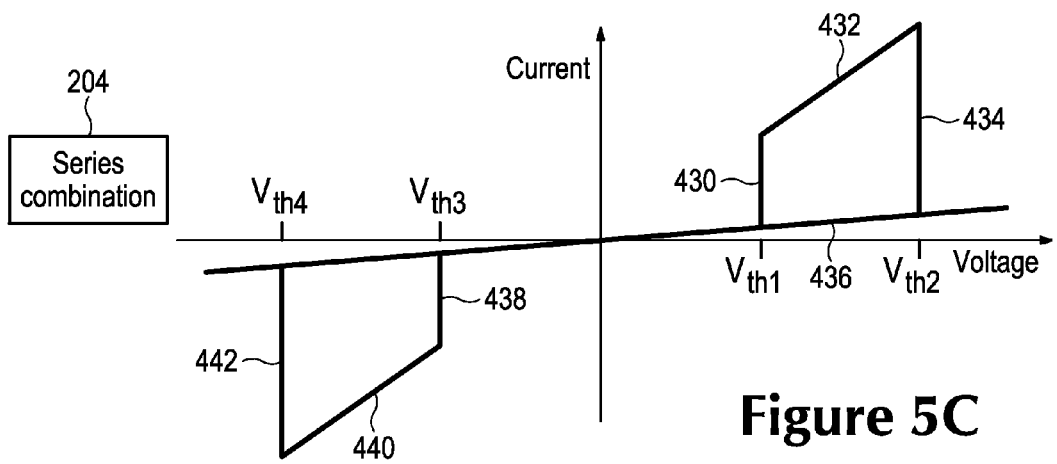
Figure 6:
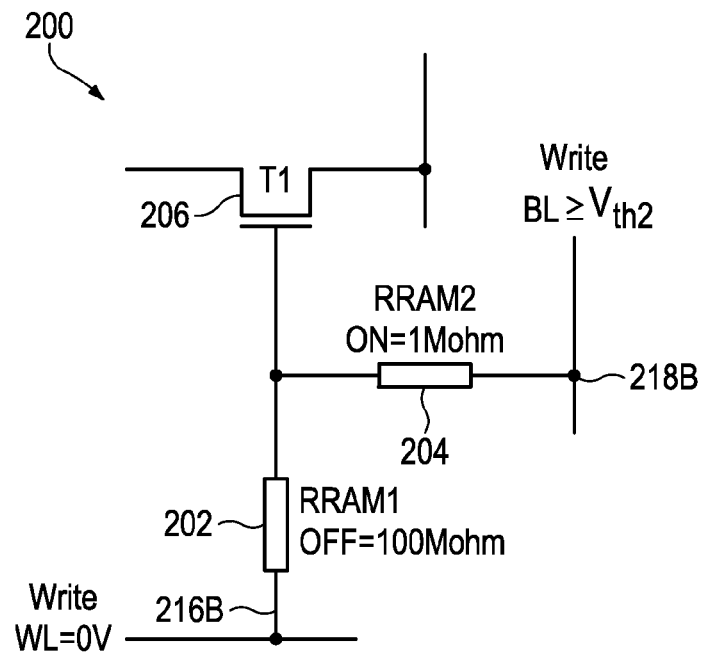
Figure 7:
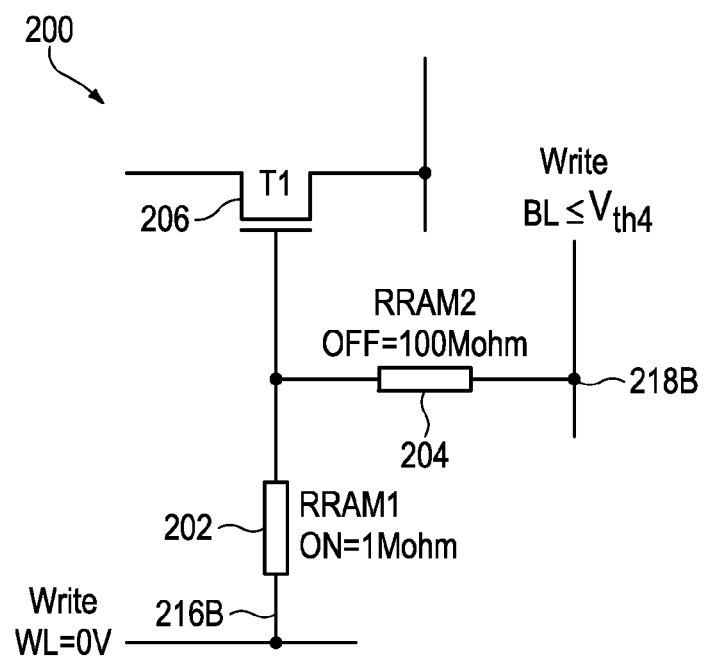
Figure 8:
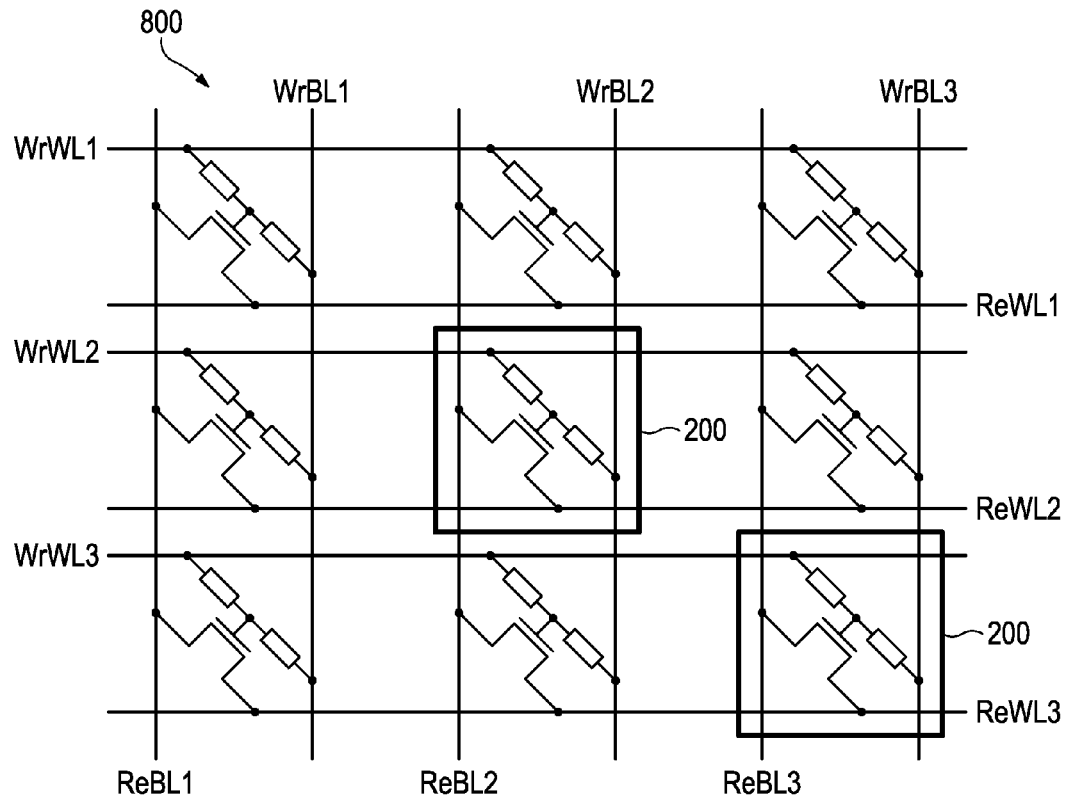
Figure 9:
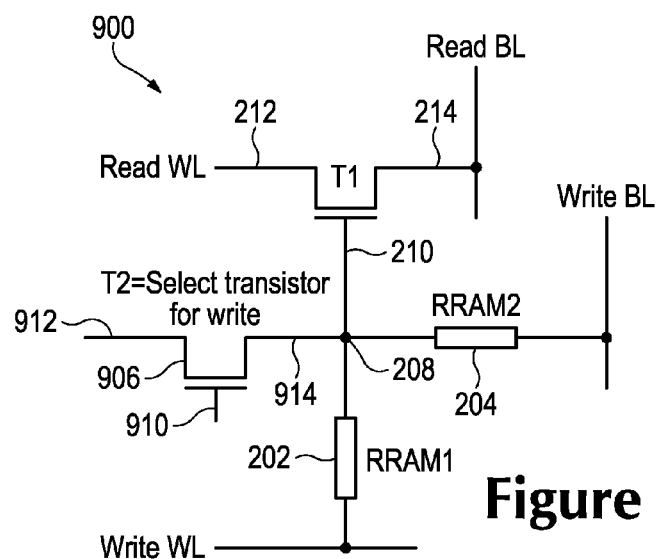
Figure 10:
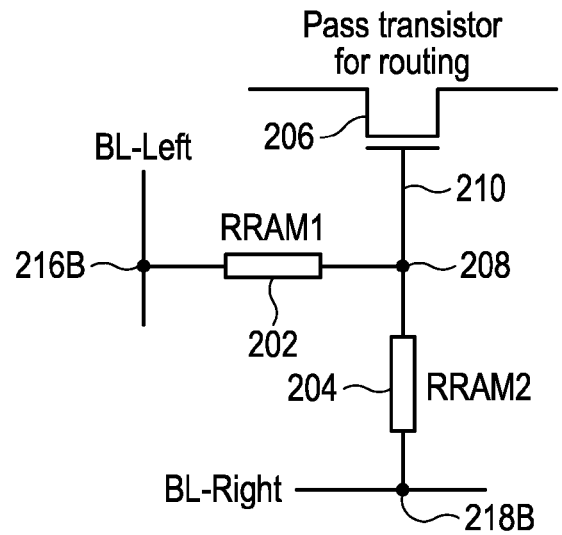
Figure 11:
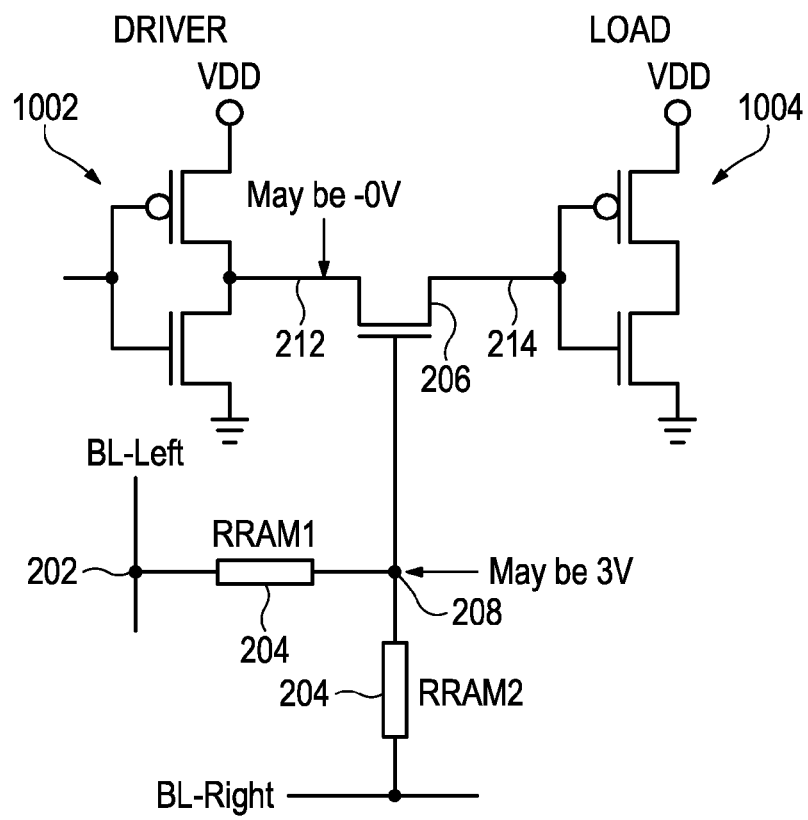
Figure 12:
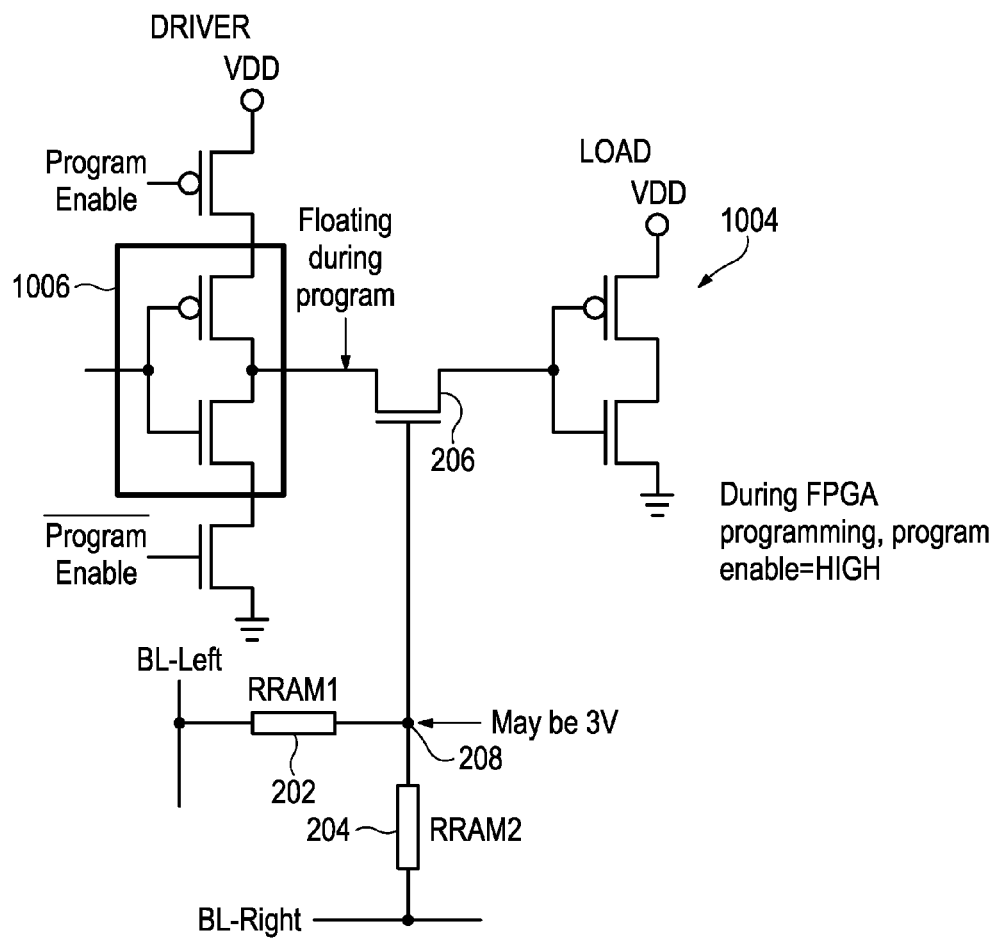
Figure 13A:
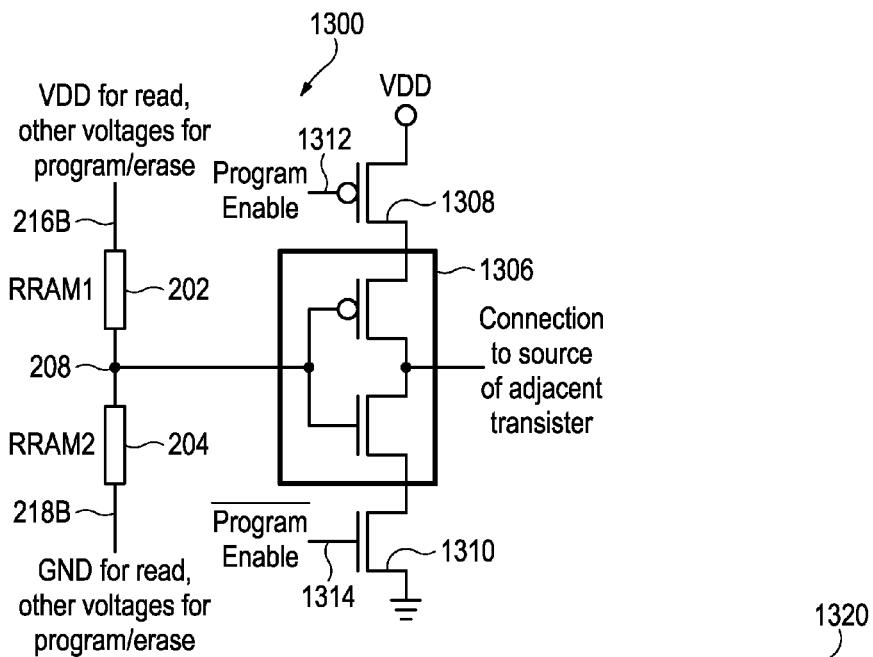
Figure 13B:
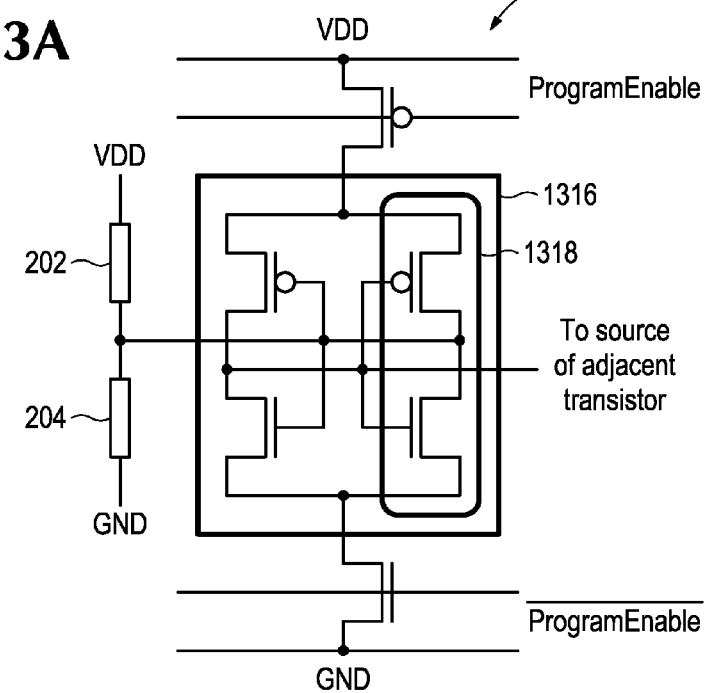
Figure 14:
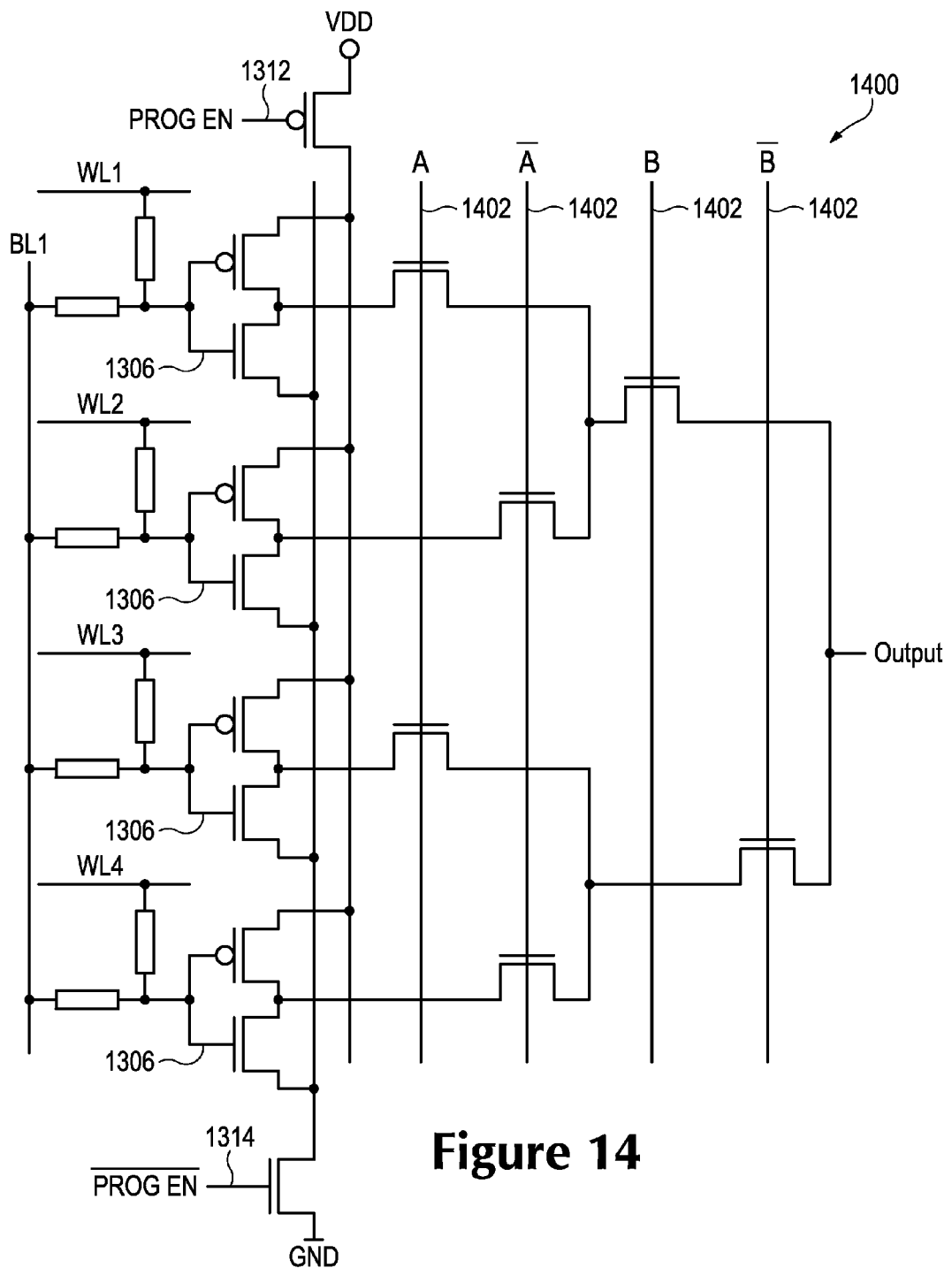
Figure 17:
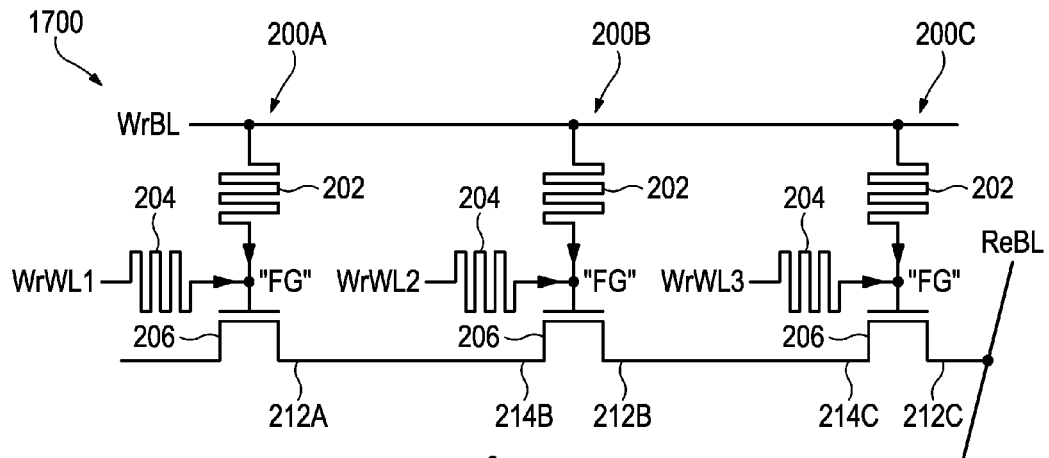
Figure 18:
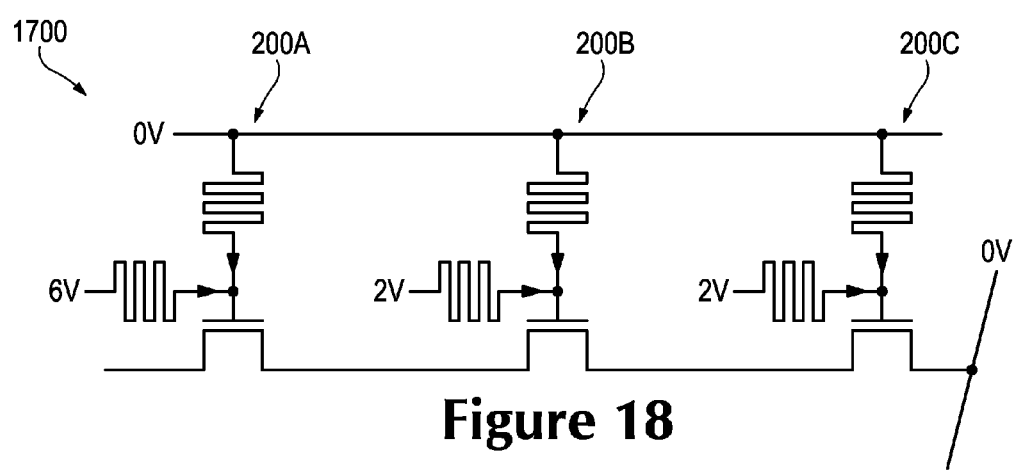
Figure 19:
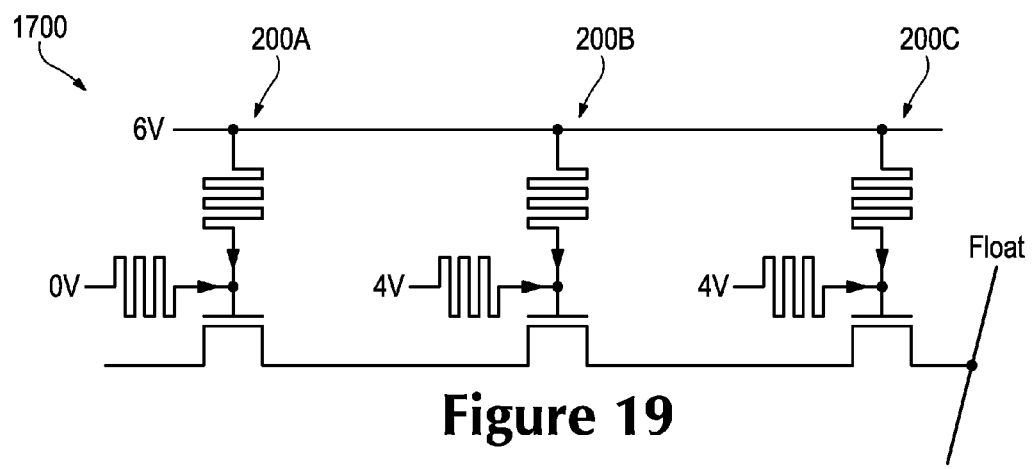
Figure 20A:
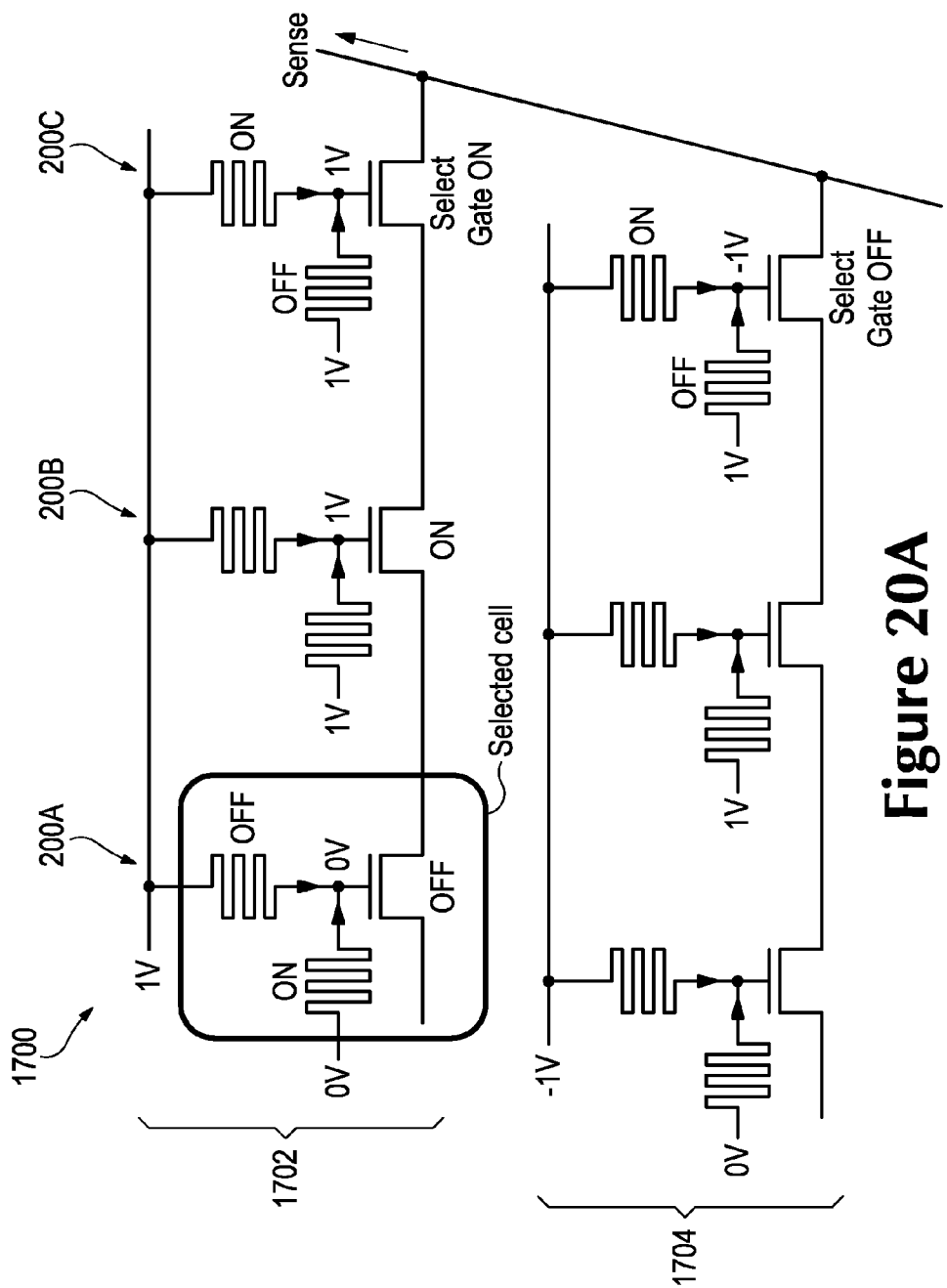
Figure 20B:
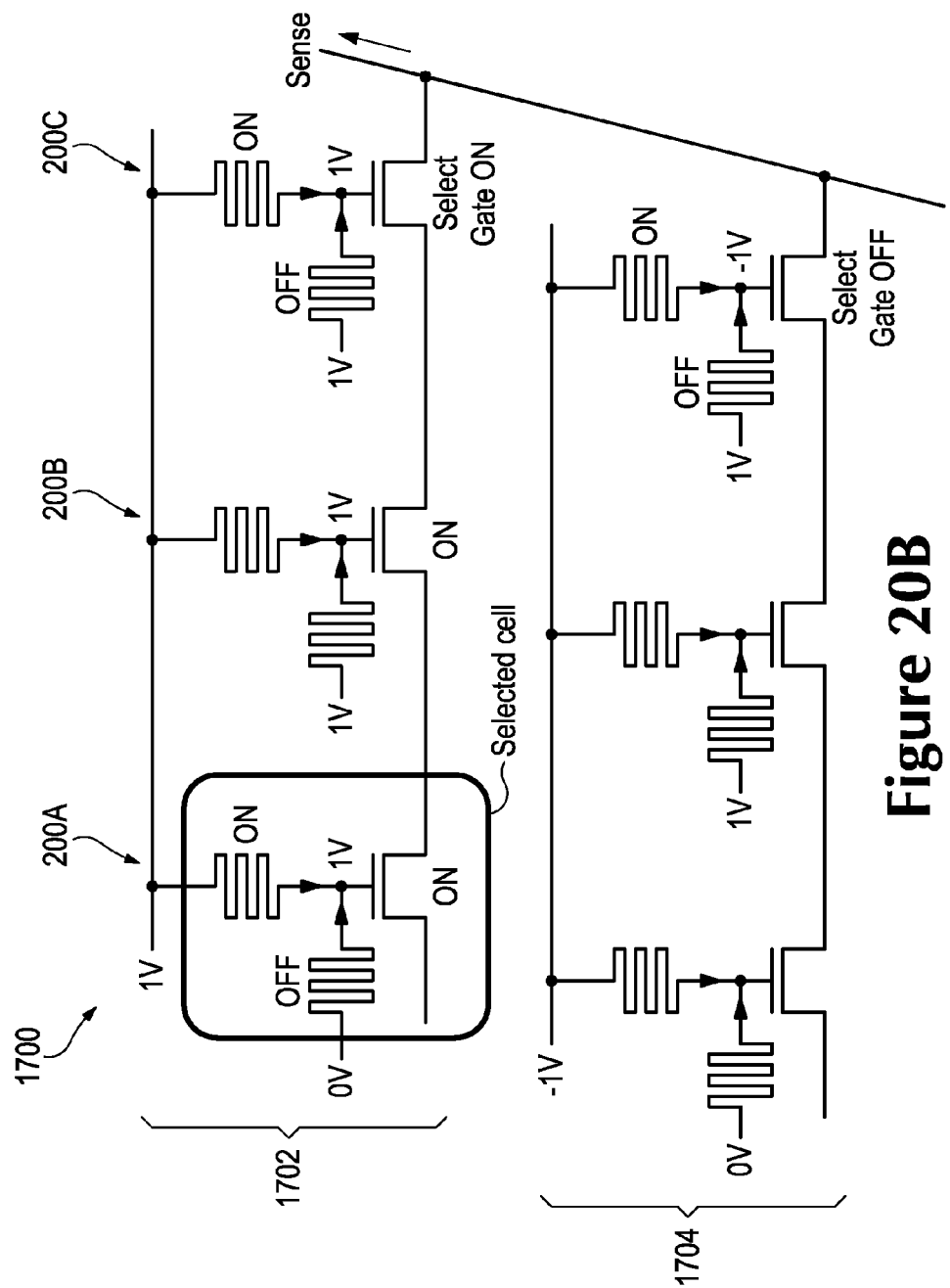

FIG. 1 is a diagram of an embodiment of a memory cell.
FIG. 2 is a diagram of an embodiment of a memory cell according to the present disclosure.
FIG. 3 is a diagram of the memory cell shown in FIG. 2 in a first state during a read operation.
FIG. 4 is a diagram of the memory cell shown in FIG. 2 in a second state during a read operation.
FIGS. 5A-5C are diagrams of embodiments of a first memory element and a second memory element along with corresponding characteristic current/voltage graphs.
FIG. 6 is a diagram of the memory cell shown in FIG. 2 during a write operation.
FIG. 7 is a diagram of the memory cell shown in FIG. 2 during an erase operation.
FIG. 8 is a diagram of an embodiment of a memory array including the memory cell shown in FIG. 2.
FIG. 9 is a diagram of an embodiment of a memory cell according to the present disclosure.
FIG. 10 is a diagram of an embodiment of a memory cell in a field programmable gate array (FPGA) according to the present disclosure.
FIG. 11 is a diagram of the memory cell shown in FIG. 10 showing conditions which result in oxide breakdown.
FIG. 12 is a diagram of the memory cell shown in FIG. 11 including a tristate driver to avoid oxide breakdown.
FIGS. 13A and 13B are diagrams of embodiments of a memory cell according to the present disclosure.
FIG. 14 is a diagram of an embodiment of a field programmable gate array look-up table according to the present disclosure.
FIG. 15 is a diagram of an embodiment of a memory cell according to the present disclosure.
FIGS. 16A and 16B are diagrams of an embodiment of the memory cell shown in FIG. 15.
FIG. 17 is a diagram of an embodiment of a memory cell 200 arranged as a NAND string according to the present disclosure.
FIG. 18 is a diagram of an embodiment of NAND string 1700 shown in FIG. 17 during a write operation.
FIG. 19 is a diagram of an embodiment of NAND string 1700 shown in FIG. 17 during an erase operation.
FIGS. 20A and 20B are diagrams of an embodiment of NAND string 1700 shown in FIG. 17 during a read operation.

DETAILED DESCRIPTION

Referring to FIG. 2, a memory cell 200 comprises a first memory element 202, a second memory element 204, and a switching element 206. First memory element 202 and second memory element 204 may be electrically coupled to a common node 208. First memory element 202 or second memory element 204 may comprise non-volatile memory of any technology, including resistive memory technology that retains stored information in the absence of power. Examples of non-volatile resistive memory technology include magnetoresistive random access memory (MRAM), ferroelectric random access memory (FRAM), resistive random access memory (RRAM), phase change memory, and the like.

First memory element 202 and second memory element 204 may comprise a complementary memory cell as explained in more detail with reference to FIGS. 5A-5C in which first memory element 202 comprises a polarity that is opposite or complementary to that of second memory element 204.

In an embodiment, first memory element 202 comprises a first terminal 216A and a second terminal 216B. Likewise, second memory element 204 comprises a third terminal 218A and a fourth terminal 218B. First memory element 202 may be serially-coupled to second memory element 204 by electrically coupling first terminal 216A to third terminal 218A, with common node 208 interposed therebetween. In an embodiment, second terminal 216B is configured to receive a write word line WrWL while fourth terminal 218B is configured to receive a write bit line WrBL from a host or other control circuitry (not shown).

Switching element 206 comprises a control terminal 210, a drain terminal 212, and a source terminal 214. Control terminal 210 may be electrically coupled to common node 208. In an embodiment, drain terminal 212 is configured to receive a read word line ReWL and source terminal 214 is configured to receive a read bit line ReBL. Switching element 206 may comprise any type of switching technology, e.g., metal oxide semiconductor (MOS) and the like. Switching element 206 may comprise a p-channel metal oxide semiconductor (PMOS) transistor having a gate as a control terminal 210.

In an embodiment, switching element 206 comprises a floating or electrically isolated well, source, drain, or a combination thereof to avoid oxide breakdown as a result of high voltages applied during write or erase operations.

FIG. 3 is a diagram of the memory cell 200 shown in FIG. 2 in a first state during a read operation. FIG. 4 is a diagram of the memory cell 200 shown in FIG. 2 in a second state during the read operation. Certain control signals are applied to first memory element 202 or to second memory element 204 in memory cell 200 to read a value stored therein, to write a value thereto, or to erase a value therefrom. Control circuitry that generates these certain control signals are well-known to a person of ordinary skill in the art and will not be discussed in any further detail herein.

Referring to FIGS. 3 and 4, first memory element 202 is configured to receive a write word line WrWL, e.g., a ground voltage, at second terminal 216B. Second memory element 204 is configured to receive a write bit line WrBL, e.g., a source voltage VDD or source voltage VDD plus a threshold voltage Vth, at fourth terminal 218B. Switching element 206 is configured to receive a read word line ReWL, e.g., source voltage VDD, at drain terminal 212. Switching element 206 is configured to read or sense a bit line ReBL at source terminal 214 to determine a value stored in memory cell 200.

Referring to FIG. 3, first memory element 202 is in a first or off state (HRS—high resistance state) and, therefore, will exhibit high impedance, e.g., 100 MΩ. Since second memory element 204 comprises a polarity that is opposite or complementary to that of first memory element 202, second memory element 204 will be in a second or on state (LRS—low resistance state) and exhibit low impedance, e.g., 1 MΩ. First memory element 202 and second memory element 204 form a resistor divider with the voltage at common node 208 driving control terminal 210 of switching element 206. In the exemplary memory cell 200 shown in FIG. 2, therefore, the voltage at common node 208 will be substantially the voltage at fourth terminal 218B, e.g., VDD or VDD+Vth. The presence of source voltage VDD or source voltage plus the threshold voltage VDD+Vth at control gate 210 will turn switching element 206 on allowing source terminal 214 to receive a current produced by the source voltage VDD at drain terminal 212 to thereby enable downstream control circuitry (not shown) to sense the value stored in memory cell 200. A person of ordinary skill in the art should recognize that the control circuitry to sense currents or voltages from memory cells is well-known and will not be described herein.

A read path between the read word line at drain terminal 212 and the read bit line at source terminal 214 does not include either first memory element 202 or second memory element 204, i.e., the read path does not include a high impedance memory element, which results in faster read speed during a read operation of memory cell 200.

In FIG. 4, first memory element 202 is in the second or on state (LRS) and, therefore, will exhibit low impedance, e.g., 1 MΩ. Since second memory element 204 comprises a polarity that is opposite or complementary to that of first memory element 202, second memory element 204 will be in the first or off state (HRS) and exhibit high impedance, e.g., 100 MΩ. Since first memory element 202 and second memory element 204 form a resistor divider with the voltage at common node 208 driving control terminal 210 of switching element 206, the voltage at common node 210 in FIG. 6 will be substantially the voltage at first terminal 216B, e.g., ground. Having a ground voltage at control gate 210 will turn switching element 206 off resulting in no current flowing from the source voltage at drain terminal 212 to source terminal 214 to thereby enable downstream control circuitry (not shown) to sense the value stored in memory cell 200.

FIGS. 5A-5C are diagrams of embodiments of first memory element 202 and second memory element 204 along with corresponding characteristic current/voltage graphs. In an embodiment, first memory element 202 and second memory element 204 may comprise a complementary memory cell in which first memory element 202 comprises a first polarity that is different from or complementary to a second polarity of second memory element 204.

First memory element 202 may comprise a titanium nitride 402, hafnium oxide 404, titanium 406, and titanium nitride 408 (TiN/HfOx/Ti/TiN) stack. Second memory element 204 may comprise a complementary stack of a titanium nitride 410, titanium 412, hafnium oxide 414, and titanium nitride 416 (TiN/Ti/HfOx/TiN). A person of ordinary skill in the art should recognize other possible combinations of materials that may be used in the manufacture of first memory element 202 or second memory element 204.

First memory element 202 exhibits the current/voltage characteristics shown in FIG. 5A. Initially, first memory element 202 will be in a high resistance state (HRS) at 420 until the voltage across first memory element 202 reaches a positive switching threshold at 422. At that point, first element 202 may change from the HRS at 420 to a low resistance state (LRS) at 424 as the electrical resistance drops and the conductivity increases abruptly. First element 202 may remain in the LRS at 424 regardless of the direction of the voltage changes across it at least until the voltage across first memory element 202 reaches a negative switching threshold at 426. First memory element 202 may change from the LRS at 424 to the HRS at 420 as the electrical resistance increases and the conductivity decreases abruptly. First element 202 may remain in the HRS at 420 regardless of the direction of the voltage changes across it at least until the voltage across first memory element 202 reaches the positive switching threshold at 422.

Second memory element 204 exhibits the current/voltage characteristics shown in FIG. 5B. Since second memory element 204 comprises a second polarity different than or complementary to the first polarity, second memory element begins in the LRS at 424. If the voltage across second memory element 204 reaches a positive switching threshold at 422, second memory element 204 changes from the LRS at 424 to the HRS at 420. Second memory element 204 may remain in the HRS at 420 regardless of the direction of the voltage changes across it at least until the voltage across second memory element 204 reaches a negative switching threshold at 426. At that point, second element 204 may change from the HRS at 420 to the LRS at 424 as the electrical resistance decreases and the conductivity increases abruptly. Second memory element 204 may remain in the LRS at 424 regardless of the direction of the voltage changes across it at least until the voltage across second memory element 204 reaches the positive switching threshold at 422.

FIG. 5C is a graph of the current/voltage characteristics associated with the serial coupling of first memory element 202 and second memory element 204. The applied voltage is divided into two voltages applied across first memory element 202 and second memory element 204, with the greater portion of the voltage being applied across the element having the higher resistance.

When the voltage applied across first memory element 202 reaches a first switching threshold Vth1 at 430, first memory element 202 switches from the HRS at 436 to the LRS at 432. Since both first memory element 202 and second memory element 204 have low electrical resistance, the total resistance of the series circuit abruptly decreases and the slope of the current/voltage characteristic curve increases. Second memory element 204 switches from the LRS at 432 to the HRS at 436 when the voltage reaches a second switching threshold Vth2 at 434. At this point, the total resistance of the series circuit abruptly increases and the slope of the current/voltage characteristic curve decreases.

Two negative switching thresholds also exist. When the voltage applied reaches a third switching threshold Vth3 at 438, second memory element 204 switches back to the LRS at 440. Since both first memory element 202 and second memory element 204 have a low resistance, total resistance of the series circuit abruptly decreases and the slope of the current/voltage characteristic curve increases. First memory element 202 switches from the LRS at 440 to the HRS at 436 when the voltage reaches a fourth switching threshold Vth4 at 442. At this point, the total resistance of the series circuit abruptly increases and the slope of the current/voltage characteristic curve decreases.

The region between first switching threshold Vth1 and second switching threshold Vth2 and the region between third switching threshold Vth3 and fourth switching threshold Vth4 represents a read operation window. When the voltage applied is in the read operation window or at least within a predetermined margin of the read operation window, first memory element 202 or second memory element 204 may be read. The predetermined margin may be used to account for manufacturing and other variability in the manufacture of first memory element 202 or second memory element 204.

FIG. 6 is a diagram of the memory cell 200 shown in FIG. 2 during a write operation in which a value is written, stored, or otherwise programmed in first memory element 202 or second memory element 204. During the write or program operation a write word line WrWL at first terminal 216B may be set to a first voltage, e.g., ground. A write bit line WrBL at fourth terminal 218B may be set to a second voltage, e.g., a voltage equal to or greater than second switching threshold Vth2. Under such conditions and since first memory element 202 and second memory element 204 are complementary or of opposite polarity, second memory element 204 will be programmed to the second or on state (LRS) while first memory element 202 will be at the first or off state (HRS).

To avoid oxide breakdown in switching element 206 due to the high write voltages applied during the write operation, control terminal 210, drain terminal 212, source terminal 214, or a combination thereof may be left floating or otherwise may be electrically isolated from first memory element 202 or second memory element 204.

FIG. 7 is a diagram of the memory cell shown in FIG. 2 during an erase operation in which a value previously written to, stored in, or programmed in first memory element 202 or second memory element 204 is erased. During the erase operation, a write word line WrWL at first terminal 216B may be set to a first voltage, e.g., ground. A write bit line at fourth terminal 218B may be set to a second voltage, e.g., a voltage equal to or less than a threshold voltage Vth4. Under such conditions and since first memory element 202 and second memory element 204 are complementary or of opposite polarity, second memory element 204 will be erased to the first or off state (HRS) while first memory element 202 will be at the second or on state (LRS).

FIG. 8 is a diagram of an embodiment of a memory array including the memory cell 200 shown in FIG. 2. Referring to FIG. 8, an array 800 comprises a plurality of memory cells 200 arranged in a cross point array including plurality of columns and a plurality of rows. Each memory cell 200 comprises a first memory element 202, a second memory element 204, and a switching element 206. Each memory cell 200 may be electrically coupled column-wise to a corresponding write bit line, e.g., WrBL1, WrBL2, and the like, and a corresponding read bit line, e.g., ReBL1, ReBL2, and the like. Each memory cell 200 may be electrically coupled row-wise to a corresponding write word line, e.g., WrWL1, WrWL2, and the like, and to a corresponding read word line, e.g., ReWL1, ReWL2, and the like. To effectuate the read operation, write bit lines WrBLs and write word lines WrWLs are connected to source voltage VDD and ground, respectively, similar to the read operation shown in FIGS. 3 and 4. Array 800 may be a single or multiple layers in a three dimensional memory stack, such as described in co-pending U.S. application Ser. No. 11/342,491 to Norman and U.S. application Ser. No. 12/653,852 also to Norman, both assigned to Unity Semiconductor Corporation and both incorporated herein by reference.

An alternative embodiment of a memory cell according to the present disclosure is shown in FIG. 9. Like memory cell 200, memory cell 900 comprises a first memory element 202 and a second memory element 204. First memory element 202 and second memory element 204 may be electrically coupled to a common node 208. First memory element 202 or second memory element 204 may comprise any type of non-volatile memory device of any technology that retains stored information in the absence of power. In an embodiment, first memory element 202 may be serially-coupled to second memory element 204 through common node 208. First memory element 202 may comprise a polarity that is opposite or complementary to that of second memory element 204.

Switching element 206 comprises a control terminal 210, a drain terminal 212, and a source terminal 214 as with memory cell 200. Control terminal 210 may be electrically coupled to common node 208. In an embodiment, drain terminal 212 is configured to receive a read word line ReWL and source terminal 214 is configured to receive a read bit line ReBL. Switching element 906 comprises a control terminal 910, a drain terminal 912, and a source terminal 914. Source terminal 914 may be electrically coupled to common node 208. Switching element 206 or switching element 906 may comprise any type of switching technology, e.g., metal oxide semiconductor (MOS) and the like. Switching element 206 or switching element 906 may comprise a p-channel metal oxide semiconductor (PMOS) transistor. A control signal received at control terminal 910 from a host or control circuitry (not shown) will turn on switching element 906 to enable sequentially writing to first memory element 202 or second memory element 204.

FIG. 10 a diagram of an embodiment of a memory cell 200 in a field-programmable gate array (FPGA) according to the present disclosure. An FPGA may comprise a plurality of memory cells 200 comprising first memory element 202, second memory element 204, and switching element 206. FPGA may be an integrated circuit designed to be configured by a customer or a designer after manufacturing—hence the term "field-programmable." The FPGA may be configured using specialized computer languages, e.g., hardware description language, and may comprise a large number of logic gates and memory blocks to implement complex digital computations. These logic gates and memory cells 200 may be interconnected using pass transistors whose gates are driven by memory block outputs. The general structure and operation of the FPGA exclusive of memory cell 200 is well known to a person of ordinary skill in the art and will not be discussed in any further detail. Incorporating memory cell 200 in the FPGA may allow for a dramatic reduction of both die size and power consumption as well as allow for the elimination of off-chip memory as is often required for SRAM-based FPGAs.

Referring to FIG. 10, memory cell 200 may comprise first memory element 202, second memory element 204, and a switching element 206. First memory element 202 and second memory element 204 may comprise a complementary memory cell where first memory element 202 and second memory element 204 are electrically coupled to common node 208. As with the memory cell 200 shown in FIG. 2, first memory element 202 or second memory element 204 may comprise non-volatile memory of any technology including resistive memory technology and first memory element 202 may comprise a polarity that is opposite or complementary to that of second memory element 204. First memory element 202 may be asymmetric relative to second memory element 204 to provide flexibility for operating the FPGA. Unlike the memory cell 200 shown in FIG. 2, terminal 216B of first element 202 is configured to receive a left bit line BL-left and terminal 218B of second element 204 is configured to receive a right bit line BL-right from a host or other control circuitry (not shown).

During a read operation, first memory element 202 and second memory element 204 are configured as a voltage divider with common node 208 driving control terminal 210 of switching element 206. Table 1 shows exemplary conditions during the read operation.

TABLE 1

| | BL-Left | BL-Right | RRAM 1 | RRAM2 | $V_{DD}$ | Pass transistor for routing |
|---|---|---|---|---|---|---|
| READ | VDD | GND | ON (1M) | OFF (100M) | VDD | ON |
| | | | OFF (100M) | ON (1M) | GND | OFF |

During a write or an erase operation, switching element 206 comprises a floating or electrically isolated well, source, drain, or a combination thereof to avoid oxide breakdown as a result of high voltages applied during the write operation or an erase operation. Switching element 206 may be a PMOS or NMOS transistor formed using a twin well process or a triple well process, which are known to a person or ordinary skill in the art. In an embodiment, the FPGA may further comprise programming transistors (not shown) that are of a higher voltage rating than those necessary for FPGAs not including first memory element 202 and second memory element 204. The programming transistors may be shared between several memory cells 200 in FPGA. Table 2 shows exemplary conditions during write or erase operations.

TABLE 2

| | BL-Left | BL-Right | RRAM 1 | RRAM2 |
|---|---|---|---|---|
| WRITE | $>V_{th2}$ | GND | OFF | ON |
| ERASE | $<V_{th4}$ | GND | ON | OFF |

Referring to FIG. 11, drain terminal 212 may be electrically coupled to a driver 1002 and source terminal 214 may be electrically coupled to a load 1004. During a write operation, source terminal 214 may be at a voltage, e.g., a ground voltage, which may cause oxide breakdown of gate terminal 210 of switching element 206. Including a tristate driver 1006 as shown in FIG. 12 avoids the oxide breakdown of control terminal 210. Tristate driver 1006 allows body, source terminal 214, drain terminal 212, or a combination thereof to float during the write operation to thereby avoid damage switching element 206.

FIGS. 13A and 13B are diagrams of embodiments of a memory cell according to the present disclosure. Referring to FIG. 13A, memory cell 1300 may comprise first memory element 202, second memory element 204, and a switching element 1306. First memory element 202 and second memory element 204 may comprise a complementary memory cell where first memory element 202 and second memory element 204 are electrically coupled to common node 208. As with the memory cell 200 shown in FIG. 2, first memory element 202 or second memory element 204 may comprise non-volatile memory of any technology including resistive memory technology and first memory element 202 may comprise a polarity that is opposite or complementary to that of second memory element 204. Switching element 1306 may comprise an input terminal that is electrically coupled to common node 208, a first terminal that is electrically coupled to switching element 1308, and a second terminal that is electrically coupled to switching element 1310. During write or erase operations, terminal 216B of first memory element 202 may receive a corresponding write signal, e.g., WL1, WL2, and the like, while terminal 218B of second memory element 204 may receive a bit line signal, e.g., BL1. During the read operation, terminal 216B of first memory element 202 and terminal 218B of second memory element 204 may be configured to receive voltages to that select the memory cell 200, e.g., terminal 216B may receive a voltage VDD and terminal 218B may receive a ground voltage GND.

Switching element 1308 may comprise a control terminal electrically coupled to a program enable signal PROG EN 1312. Switching element 1310 may comprise a control terminal electrically coupled to an inverse program enable signal/PROG EN 1314. Switching element 1306 may comprise a tristate driver with a gate or well that is left floating during the write or erase operation to avoid oxide breakdown based on program enable signal PROG EN 1312 and inverse program enable signal/PROG EN 1314 turning on or off switching elements 1308 and 1310, respectively.

Referring to FIG. 13B, memory cell 1320 comprises the same components of memory cell 1300, except that switching element 1316 includes two additional devices 1318 relative to switching element 1306 that latch the read or sensed value from first memory element 202 and second memory element 204. Additional devices 1318 may be smaller relative to the devices comprising switching element 1316, e.g., additional devices 1318 may have gates with a smaller width to length ratio because they do not need to supply as much current as the devices comprising switching element 1316. The devices comprising switching element 1306 may be larger to supply more current to the multiplexer tree receiving inputs 1402 shown in FIG. 14. First memory element 202 may receive a word line signal WL at terminal 216B and second memory element 204 may receive a bit line signal BL at terminal 218B during a program or erase operations and voltages VDD and GND, respectively, during a read operation. Switching element 1316 may be a CMOS cross-coupled latch.

FIG. 14 is a diagram of an embodiment of an FPGA look-up table according to the present disclosure. Referring to FIGS. 13 and 14, memory cell 1300 may be used as a building block in an n-bit FPGA look-up table (LUT) 1400. LUT 1400 may comprise inputs 1402 configured to read memory cells 1300 during the read operation based on input signals 1402. LUT 1400 may comprise a plurality of memory cells 1300, each memory cell 1300 configured to receive a corresponding write line signal, e.g., WL1, WL2, and the like, at a terminal 216B of first memory element 202. Each memory cell 1300 may also be configured to receive a common bit line signal, e.g., BL1, at a terminal 218B of second memory element 204.

During the write or erase operation, switching elements 1306 float based on the program enable signal PROG EN 1312 and inverse program enable signal /PROG EN 1314.

FIG. 15 is a diagram of an embodiment of a memory cell according to the present disclosure. FIGS. 16A and 16B are diagrams of an embodiment of the memory cell shown in FIG. 15. Referring to FIGS. 15, 16A, and 16B, a memory cell 1500 may comprise first memory element 202, second memory element 204, switching element 206, and a switching element 1506. First memory element 202 and second memory element 204 may comprise a complementary memory cell where first memory element 202 and second memory element 204 are electrically coupled to common node 208. As with the memory cell 200 shown in FIG. 2, first memory element 202 or second memory element 204 may comprise non-volatile memory of any technology including resistive memory technology and first memory element 202 may comprise a polarity that is opposite or complementary to that of second memory element 204.

Switching element 206 may comprise a control terminal 210 that is electrically coupled to common node 208. Switching element 1516 may comprise a first input electrically coupled to common node 208 and a second input electrically coupled to a word line signal WL. Switching element 1506 may be constructed of polysilicon atop a tungsten wiring layer or an n+ doped region of a substrate as is shown in more detail in FIG. 16A. Switching element 1506 may alternatively be constructed using selective epitaxial growth atop n+ single crystal silicon regions as shown in more detail in FIG. 16B. Terminal 216B of first memory element 202 may be electrically coupled to a left bit line signal BL-left and terminal 218B of second memory element 204 may be electrically coupled to a right bit line signal BL-right. Switching element 1506 may be used during verify and read-after-write operations.

FIG. 17 is a diagram of an embodiment of a memory cell 200 arranged as a NAND string according to the present disclosure. Referring to FIG. 17, a plurality of memory cells 200A, 200B, and 200C may be arranged as a NAND string 1700. Memory cell 200A may comprise first memory element 202, second memory element 204, and a switching element 206. Memory cells 200B and 200C may have a construction similar to that of memory cell 200A. First memory element 202 and second memory element 204 may comprise a complementary memory cell where first memory element 202 and second memory element 204 are electrically coupled to common node 208. As with the memory cell 200 shown in FIG. 2, first memory element 202 or second memory element 204 may comprise non-volatile memory of any technology including resistive memory technology and first memory element 202 may comprise a polarity that is opposite or complementary to that of second memory element 204. Switching element 206 may comprise control terminal 210 that is electrically coupled to common node 208. Terminal 216B of memory cells 200A, 200B, and 200C may be electrically coupled to a common write bit line signal WrBL. Terminal 218B of memory cell 200A may be electrically coupled to a corresponding write word line signal WrWL1. Similarly, terminals 218B of memory cell 200B and memory cell 200C may be electrically coupled to corresponding write word line signals WrWL2 and WrWL3, respectively.

A terminal 212A of memory cell 200A may be electrically coupled to a terminal 214B of memory cell 200B. A terminal 212B of memory cell 200B, in turn, may be electrically coupled to a terminal 214C of memory cell 200C. A terminal 212C of memory cell 200C may be electrically coupled to receive a read bit line signal ReBL.

FIG. 18 is a diagram of an embodiment of NAND string 1700 shown in FIG. 17 during a write operation. FIG. 19 is a diagram of an embodiment of NAND string 1700 shown in FIG. 17 during an erase operation. Referring to FIGS. 17, 18 and 19, a value may be written to or erased from memory cell 200A using a variety of biasing schemes, e.g., a 1/3 biasing scheme in which write word signal WrWL1 is set to three times the voltage of write word signals WrWL2 and WrWL3 as shown in FIG. 18. Read bit line signal ReBL may be set to ground or left floating during the write operation.

For example, to write to memory cell 200A, write bit line WrBL may be set to 0V, write word signal WrWL1 may be set to 6V, and write word signals WrWL2 and WrWL3 are each set to 2V. Read bit line signal ReBL may be set to float.

For another example, to erase memory cell 200A, write bit line WrBL may be set to 6V, write word signal WrWL1 may be set to 0V, and write word signals WrWL2 and WrWL3 are each set to 4V. Read bit line signal ReBL may be set to float.

FIGS. 20A and 20B are diagrams of an embodiment of NAND string 1700 shown in FIG. 17 during a read operation. Referring to FIGS. 20A and 20B, during the read operation, a selected memory cell 200A is biased such that a voltage at node 208 changes based on the state of first memory element 202 and second memory element 204. Switching element 206 is on or off depending on the voltage at node 208. In an embodiment, switching element 206 turns on when the voltage at node 208 is above a threshold voltage for switching element 206 or turns off when the voltage at node 208 is below the threshold voltage for switching element 206. Switching element 206 of memory cell 200C closest to the read bit line signal ReBL may operate as a select gate for the string comprising selected memory cell 200A. In an embodiment, read bit line ReBL may provide a fixed bit pattern to thereby turn on switching element 206 of memory cell 200C and select string 1702 comprising selected memory cell 200A while turning off switching elements 206 in unselected string 1704.

A person of ordinary skill in the art will recognize that they may make many changes to the details of the above-described memory device without departing from the underlying principles. Only the following claims, however, define the scope of the memory device.

The invention claimed is:

1. A memory cell, comprising:
a first resistive memory element;
a second resistive memory element serially electrically coupled with the first resistive memory element at a common node; and
a first switching element comprising a control terminal electrically coupled with the common node;
wherein the first resistive memory element comprises a first polarity; and
wherein the second resistive memory element comprises a second polarity different than the first polarity or a second polarity complementary to the first polarity.

2. The memory cell of claim 1,
wherein the first resistive memory element comprises a first terminal and a second terminal;
wherein the first terminal of the first resistive memory element is electrically coupled with the common node;
wherein the second terminal of the first resistive memory element is electrically coupled with a write word line signal.

3. The memory cell of claim 2,
wherein the second resistive memory element comprises a third terminal and a fourth terminal;

wherein the third terminal of the second resistive memory element is electrically coupled with the common node; and wherein the fourth terminal of the second resistive memory element is electrically coupled with a write bit line signal.

4. The memory cell of claim 3, wherein the first switching element further comprises a drain terminal and a source terminal;

wherein the drain terminal is electrically coupled with a read word line signal; and wherein the source terminal is electrically coupled with a read bit line signal.

5. The memory cell of claim 1, wherein the first switching element comprises a transistor;

wherein the control terminal comprises a gate of the transistor; and wherein at least one of the first resistive memory element and the second resistive memory element are configured to drive the gate of the transistor.

6. The memory cell of claim 1, wherein the first switching element comprises a transistor; and wherein the transistor comprises a floating well, a floating source, a floating drain, or a combination thereof.

7. A method, comprising:

passing current through serial-coupled first and second resistive memory devices; and coupling a voltage state at a common node between the first and second resistive memory devices to a gate of a transistor device, such that a state of the first transistor is controlled by at least one of a first or second resistances corresponding to the first and second resistive memory devices;

wherein the first resistive memory device comprises a first polarity; and wherein the second resistive memory device comprises a second polarity different than the first polarity or a second polarity complementary to the first polarity.

8. The method of claim 7, further comprising:

electrically coupling a first terminal of the first resistive memory device and a third terminal of the second resistive memory device to the common node; and reading a value of the first resistive memory device or the second resistive memory device in response to:

applying a write bit line voltage to a second terminal of the first resistive memory device;

applying a write word line voltage to a fourth terminal of the second resistive memory device; and applying a read word line voltage to a drain terminal of the transistor device.

9. The method of claim 7, further comprising:

electrically coupling a first terminal of the first resistive memory device and a third terminal of the second resistive memory device to the common node; and programming a value in the first resistive memory device or the second resistive memory device in response to:

applying a write bit line voltage to a second terminal of the first resistive memory device;

applying a write word line voltage to a fourth terminal of the second resistive memory device; and electrically isolating a well, a source, a drain, or a combination thereof of the transistor device.

10. The method of claim 9, wherein the write bit line voltage is greater than or equal to a predetermined threshold voltage.

11. The method of claim 7, further comprising:

coupling a first tristate device to a source terminal of the transistor device; and coupling a second tristate device to a drain terminal of the transistor device.

12. The method of claim 11, further comprising:

coupling a first power transistor to the first tristate device and to a voltage source;

coupling a second power transistor to the second tristate device and to ground; and applying a program enable signal to a first gate terminal of the first power transistor and to a second gate terminal of the second power transistor in a programming operation.

13. A memory device, comprising:

a plurality of resistive memory cells, each resistive memory cell including:

a first resistive memory element;

a second resistive memory element electrically coupled with the first resistive memory element at a common node between the first resistive memory element and the second resistive memory element; and a switching element comprising a control terminal electrically coupled with the first resistive memory element and the second resistive memory element at the common node;

wherein the first resistive memory element comprises a first polarity; and wherein the second resistive memory element comprises a second polarity different than the first polarity or a second polarity complementary to the first polarity.

14. The memory device of claim 13, further comprising:

a plurality of write word line signals arranged in a first direction, each of the write word lines being electrically coupled with a terminal of a corresponding first resistive memory element; and a plurality of write bit line signals arranged in a second direction different than the first direction, each of the write bit lines being electrically coupled with a terminal of a corresponding second resistive memory element.

15. The memory device of claim 14, further comprising:

a plurality of read word line signals arranged in the first direction, each of the read word lines being electrically coupled with a source terminal of a corresponding switching element; and a plurality of read bit line signals arranged in the second direction, each of the read bit lines being electrically coupled with a drain terminal of a corresponding switching element.

16. The memory device of claim 13, wherein the first resistive memory element comprises a first terminal and a second terminal;

wherein the second resistive memory element comprises a third terminal and a fourth terminal;

wherein the first terminal of the first resistive memory element and the third terminal of the second resistive element is electrically coupled with the common node;

wherein the second terminal of the first resistive memory element is electrically coupled with a left bit line signal; and wherein the fourth terminal of the second resistive memory element is electrically coupled with a right bit line signal.

17. The memory device of claim 13, wherein the switching element comprises a transistor; and wherein the transistor comprises a floating well, a floating source, a floating drain, or a combination thereof during a program operation or an erase operation.

* * * * *